US012696395B2

(12) United States Patent
Lee et al.

(10) Patent No.: US 12,696,395 B2
(45) Date of Patent: Jul. 28, 2026

(54) DISPLAY DEVICE

(71) Applicant: Samsung Display Co., LTD., Yongin-si (KR)

(72) Inventors: Kyung-Mok Lee, Yongin-si (KR); Youngmin Cho, Yongin-si (KR); Dong-Youb Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 316 days.

(21) Appl. No.: 18/517,388

(22) Filed: Nov. 22, 2023

(65) Prior Publication Data

US 2024/0260192 A1     Aug. 1, 2024

(30) Foreign Application Priority Data

Jan. 27, 2023    (KR) ......................... 10-2023-0010963

(51) Int. Cl.
H05K 1/18              (2026.01)

(52) U.S. Cl.
CPC ..... H05K 1/18 (2013.01); *H05K 2201/09027* (2013.01); *H05K 2201/09063* (2013.01); *H05K 2201/09072* (2013.01); *H05K 2201/10037* (2013.01); *H05K 2201/10128* (2013.01); *H05K 2201/10537* (2013.01)

(58) Field of Classification Search
CPC ........... H05K 1/18; H05K 2201/09027; H05K 2201/09063; H05K 2201/09072; H05K 2201/10037; H05K 2201/10128; H05K 2201/10537

USPC .......................................................... 361/783
See application file for complete search history.

(56) References Cited

U.S. PATENT DOCUMENTS

| | | | | |
|---|---|---|---|---|
| 10,559,603 | B2 * | 2/2020 | Chen | .................... G02F 1/13452 |
| 2022/0085000 | A1 * | 3/2022 | Yao | ....................... H01L 23/552 |
| 2024/0045292 | A1 * | 2/2024 | Feng | ................. G02F 1/136295 |

FOREIGN PATENT DOCUMENTS

| | | |
|---|---|---|
| KR | 10-1383085 | 4/2014 |
| KR | 10-2018-0028081 | 3/2018 |
| KR | 10-2021-0086318 | 7/2021 |
| KR | 10-2022-0108242 | 8/2022 |

* cited by examiner

*Primary Examiner* — Binh B Tran
(74) *Attorney, Agent, or Firm* — Lerner David LLP

(57) ABSTRACT

A display device includes a display panel and a circuit board. The display panel includes a display region and a bonding region. A plurality of pixels is disposed in the display region. The bonding region is spaced apart from the display region in a first direction. A plurality of pad electrodes is disposed in the bonding region. The circuit board is disposed on the display panel. The circuit board includes a first portion overlapping the display panel between the display region and the bonding region in a plan view. Accordingly, a dead space of the display device may be reduced, and a region in which a battery or the like is disposed in the display device may be secured by reducing an area in which the circuit board is disposed after the display panel is bent.

18 Claims, 15 Drawing Sheets

100

PA

AA

BEA

BOA

DISPLAY DEVICE

CROSS-REFERENCE TO RELATED APPLICATION(S)

This application claims priority to and the benefits of Korean Patent Application No. 10-2023-0010963 under 35 U.S.C. § 119, filed on Jan. 27, 2023, in the Korean Intellectual Property Office (KIPO), the entire contents of which are incorporated herein by reference.

BACKGROUND

1. Field

Embodiments relate to a display device including a circuit board.

2. Description of the Related Art

A display device may include a display panel and a printed circuit board. The display panel may include a light-emitting diode and a pixel circuit. The printed circuit board may include a connector, a component, or the like. The connector may receive an outer signal, and the component may perform various operations such as processing a driving signal or the like.

The printed circuit board may be electrically connected to a pad portion of the display panel. In other words, the printed circuit board may include a first portion overlapping the pad portion of the display panel and a second portion not overlapping the pad portion of the display panel.

SUMMARY

Embodiments provide a display device.

A display device according to an embodiment of the disclosure may include a display panel and a circuit board. The display panel may include a display region and a bonding region. A plurality of pixels may be disposed in the display region. The bonding region may be spaced apart from the display region in a first direction. A plurality of pad electrodes may be disposed in the bonding region. The circuit board may be disposed on the display panel. The circuit board may include a first portion overlapping the display panel between the display region and the bonding region in a plan view.

In an embodiment, the circuit board may further include a second portion, and the second portion may extend from the first portion in the first direction and may overlap the bonding region of the display panel in a plan view.

In an embodiment, the circuit board may further include a third portion. The third portion may extend from the second portion in the first direction and may be spaced apart from the display panel. The third portion of the circuit board may be a space in which a line is disposed.

In an embodiment, in a plan view, the first portion of the circuit board may have a first area, and the third portion of the circuit board may have a second area less than the first area.

In an embodiment, the display device may further include a driving chip. The driving chip may be disposed on the display panel between the display region and the bonding region. A first hole may be defined in the circuit board at a position overlapping the driving chip in a plan view.

In an embodiment, in a plan view, an area of the first hole may be greater than an area of the driving chip.

In an embodiment, a second hole may be further defined in the circuit board at a position adjacent to the bonding region of the display panel.

In an embodiment, a width of the second hole may be greater than a width of the bonding region. The width of the second hole and the width of the bonding region may each be a width in a second direction intersecting the first direction.

In an embodiment, the first and second holes may be integral with each other.

In an embodiment, the display panel may further include a bending region between the display region and the bonding region, and the display panel may be curved in the bending region.

In an embodiment, the first portion of the circuit board may be disposed to overlap the display panel between the bending region and the bonding region in a plan view.

In an embodiment, the display device may further include a battery. In a plan view, the circuit board may overlap an upper surface of the display panel in which the plurality of pixels are disposed, and the battery may overlap a lower surface of the display panel farthest from the upper surface of the display panel.

A display device according to another embodiment of the disclosure may include a display panel, a driving chip, and a circuit board. The display panel may include a display region and a bonding region. The bonding region may be spaced apart from the display region in a first direction. A plurality of pixels may be disposed in the display region. A plurality of pad electrodes may be disposed in the bonding region. The driving chip may be disposed on the display panel between the display region and the bonding region. The circuit board may include a first portion, a second portion, and a third portion. The first portion of the circuit board may be spaced apart from a first side of the driving chip. The first side of the driving chip may be disposed farthest from the display region in the first direction. The second portion of the circuit board may be spaced apart from a second side of the driving chip in a second direction. The second side may intersect the first side. The second direction may intersect the first direction. The third portion of the circuit board may be spaced apart from a third side of the driving chip in an opposite direction of the second direction. The third side and the second may face each other in the opposite direction of the second direction.

In an embodiment, a vertical distance between an end of the display region and an end of the driving chip may be less than a vertical distance between the end of the display region and an end of the first portion of the circuit board, in the second direction.

In an embodiment, a vertical distance between an end of the display region and an end of the driving chip may be greater than a vertical distance between the end of the display region and an end of the third portion of the circuit board in the second direction.

In an embodiment, the display panel may further include a bending region between the display region and the bonding region, and the display panel may be curved in the bending region.

In an embodiment, the circuit board may be disposed overlapping the display panel between the bending region and the bonding region in a plan view.

In an embodiment, a width of the driving chip may be less than a width of the first portion of the circuit board, and each of the width of the driving chip and the width of the first portion of the circuit board may be a width in the second direction.

In an embodiment, the circuit board may further include an alpha region extending in the first direction from a portion of the circuit board overlapping the bonding region in a plan view, and the alpha region may be a space in which a line is disposed.

In an embodiment, the display device may further include a battery. The driving chip and the circuit board may overlap an upper surface of the display panel on which the plurality of pixels are disposed in a plan view, and the battery may overlap a lower surface of the display panel farthest from the upper surface of the display panel, in a plan view.

The display device according to an embodiment of the disclosure may include the display panel and the circuit board. The display panel may include the display region and the bonding region. The plurality of pixels may be disposed in the display region. The bonding region may be spaced apart from the display region in the first direction. The plurality of pad electrodes may be disposed in the bonding region. The circuit board may be disposed on the display panel. The circuit board may include the first portion overlapping the display panel between the display region and the bonding region in a plan view. Accordingly, a space in which a battery or the like is disposed may be secured by reducing a dead space of the display device or by reducing an area in which the circuit board is disposed after the display panel is bent.

In the display device, an interference between the driving chip and the circuit board may be avoided by defining the first hole in the circuit board at a position overlapping the driving chip in a plan view.

In the display device, a step between the bonding region and another region may be overcome by further defining the second hole in the circuit board adjacent to the bonding region of the display panel.

The display device according to an embodiment of the disclosure may include the display panel including the display region in which the plurality of pixels are disposed and the bonding region spaced apart from the display region in the first direction and in which the plurality of pad electrodes are disposed, the driving chip disposed on the display panel between the display region and the bonding region, and the circuit board. The circuit board may include the first portion spaced apart from the first side of the driving chip that is disposed farthest from the display region in the first direction, the second portion spaced apart from a second side of the driving chip intersecting the first side of the driving chip in the second direction intersecting the first direction, and the third portion spaced apart from the third side of the driving chip facing the second side of the driving chip in a direction opposite to the second direction. Accordingly, a space in which a battery or the like is disposed may be secured by reducing the dead space of the display device or by reducing the area in which the circuit board is disposed after the display panel is bent.

BRIEF DESCRIPTION OF THE DRAWINGS

FIGS. 5, 6, 7, and 8 are views illustrating an effect of the display device of FIG. 1.

DETAILED DESCRIPTION OF THE EMBODIMENTS

Figure 1:
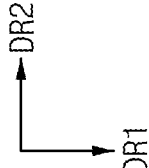
FIG. 1 is a plan view of a display device according to an embodiment of the disclosure.

Hereinafter, embodiments will be described in more detail with reference to the accompanying drawings. The same reference numerals are used for the same components in the drawings, and redundant descriptions of the same components will be omitted.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Herein, the term "dead space" may be understood as a space which is devoted to accommodating one or more components that, either singularly or plurally, perform an intended function.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
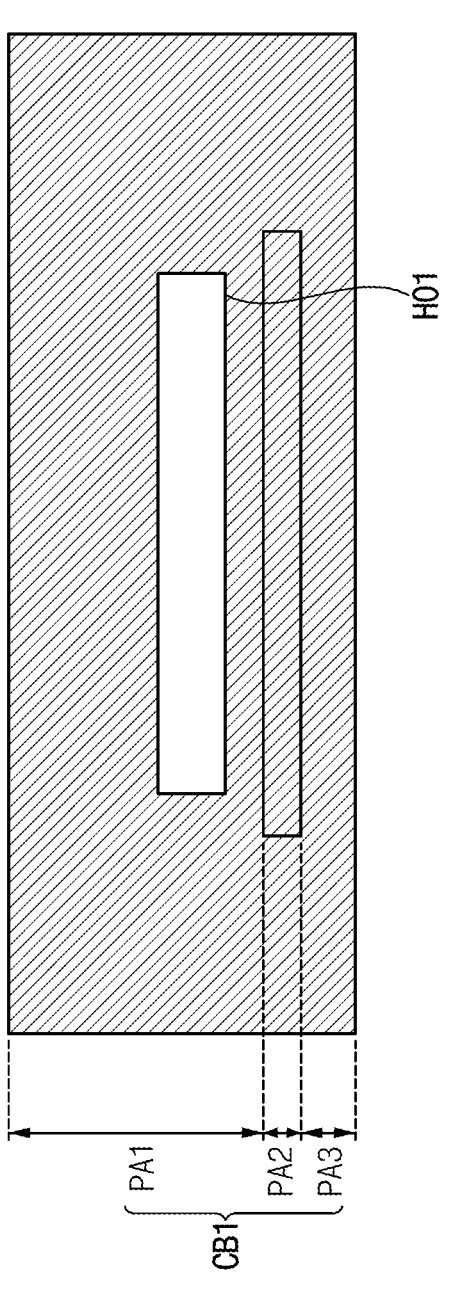
FIG. 2 is a plan view of the circuit board included in the display device of FIG. 1.
Figure 2:
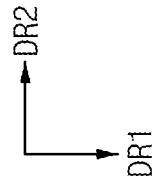
Figure 3:
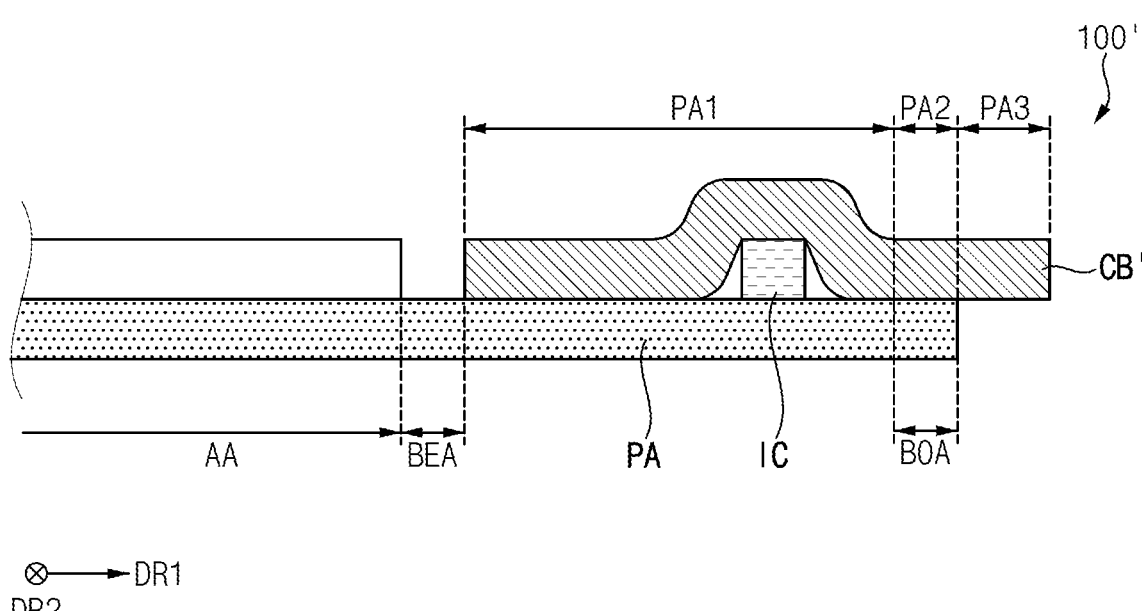
FIGS. 3 and 4 are schematic cross-sectional views illustrating a first hole of the circuit board included in the display device of FIG. 1.
Figure 4:
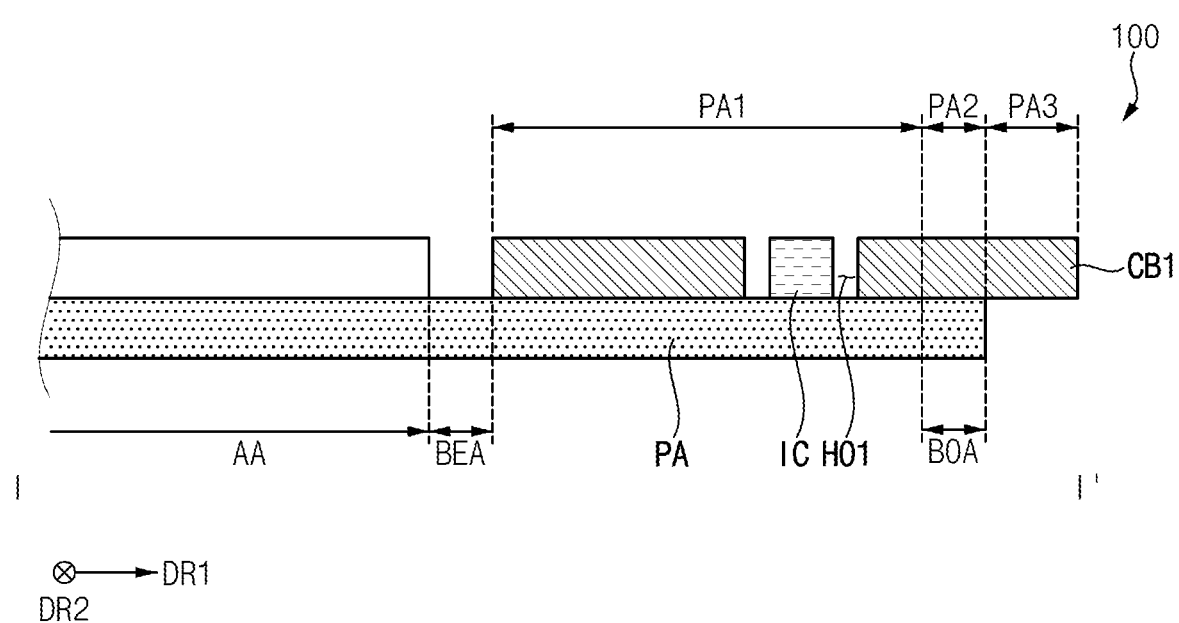

FIG. 1 is a plan view of a display device according to an embodiment of the disclosure. FIG. 2 is a plan view of the circuit board included in the display device of FIG. 1. FIGS. 3 and 4 are schematic cross-sectional views illustrating a first hole of the circuit board included in the display device of FIG. 1.

For example, FIG. 3 is a schematic cross-sectional view of a display device according to a comparative embodiment. FIG. 4 is a schematic cross-sectional view taken along line I-I' of FIG. 1.

Figure 8:
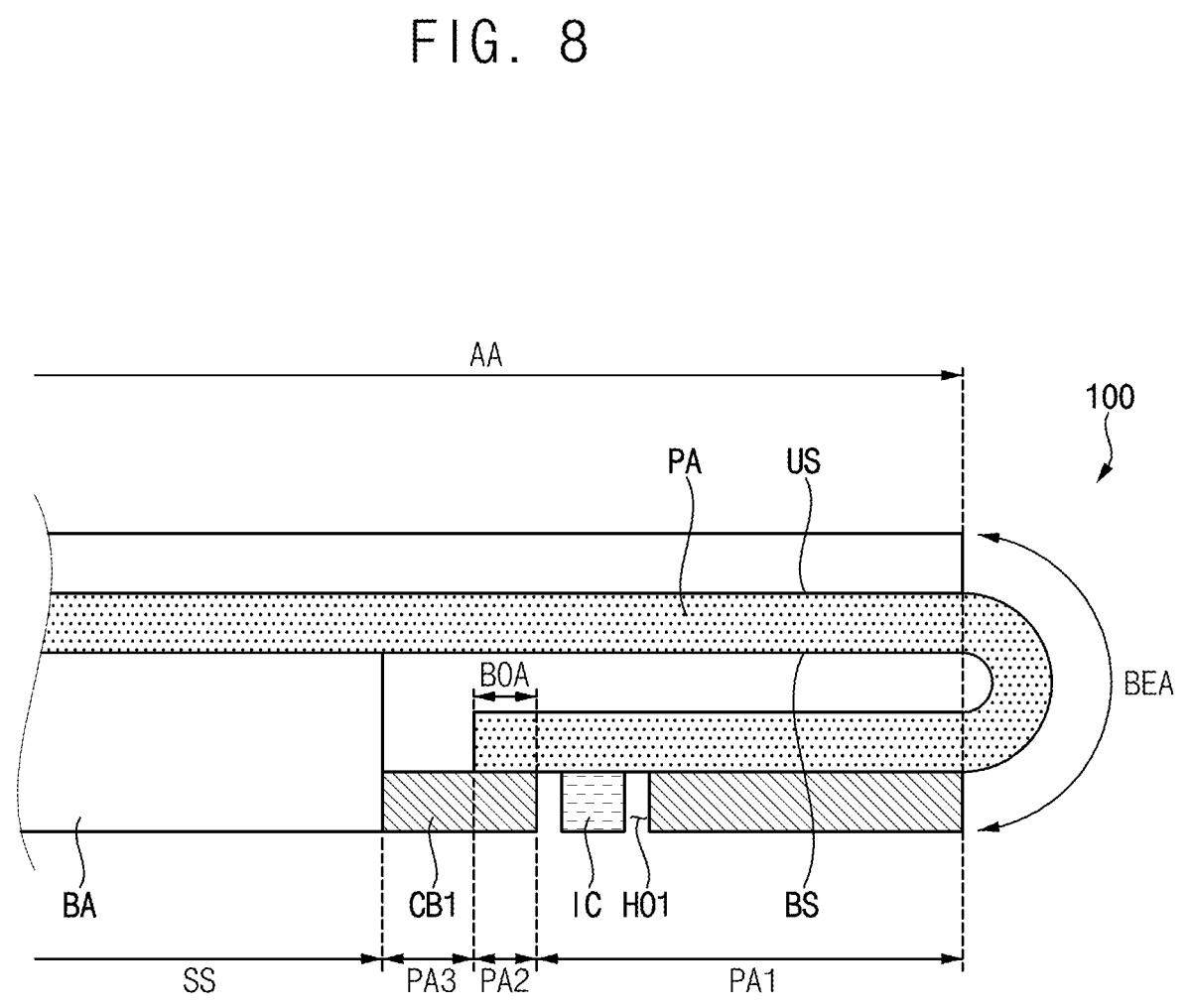

Referring to FIGS. 1, 2, 3, and 4, a display device 100 according to an embodiment of the disclosure may include a display panel PA, a driving chip IC, a circuit board CB1, and a battery (e.g., a battery BA of FIG. 8).

The display panel PA may include a display region AA and a bonding region BOA.

Multiple pixels PX may be disposed in the display region AA.

The bonding region BOA may be spaced apart from the display region AA in a first direction DR1. Multiple pad electrodes may be disposed in the bonding region BOA.

In an embodiment, the display panel PA may further include a bending region BEA between the display region AA and the bonding region BOA. The display panel PA may be curved in the bending region BEA, and the display panel PA may include a flexible substrate. For example, the flexible substrate may include polyimide ("PI").

In another embodiment, the bending region BEA may be omitted in the display panel PA, and the display panel PA may include a rigid substrate. For example, the rigid substrate may include a glass.

The driving chip IC may be disposed on the display panel PA. For example, the driving chip IC may be disposed between the display region AA and the bonding region BOA.

The driving chip IC may drive the display panel PA. For example, a timing controller may be embedded in the driving chip IC. The driving chip IC may perform various operations for driving the display panel PA, such as timing control or converting an analog signal into a digital signal.

The circuit board CB1 may be disposed on the display panel PA. The circuit board CB1 may be disposed to overlap the display panel PA between the display region AA and the bonding region BOA in a plan view. For example, the circuit board CB1 may be disposed to overlap the display panel PA between the bending region BEA and the bonding region BOA in a plan view. For example, the circuit board CB1 may have a picking part spaced about 2 millimeters (mm) from the bending region BEA disposed between the display region AA and the bonding region BOA. In case that an equipment bends the display panel PA, the equipment may pick the picking part.

However, the disclosure is not limited thereto. The circuit board CB1 may be disposed adjacent to the bending region BEA. In case that the display device 100 includes a rigid substrate, the circuit board CB1 may be disposed adjacent to the display region AA. For example, the circuit board CB1 may be a flexible printed circuit board ("FPCB").

The circuit board CB1 may include a first portion PA1, a second portion PA2, and a third portion PA3.

The first portion PA1 may overlap the display panel PA between the display region AA and the bonding region BOA in a plan view.

The second portion PA2 may extend from the first portion PA1 in the first direction DR1 and overlap the bonding region BOA of the display panel PA in a plan view. For example, the second portion PA2 may be a portion of the display panel PA to which pressure is applied.

The third portion PA3 may extend from the second portion PA2 in the first direction DR1 and offset from the display panel PA in a plan view. In other words, the third portion PA3 might not overlap the display panel PA in a plan view.

In an embodiment, the third portion PA3 of the circuit board CB1 may be a space in which a line is disposed. For example, the line may be a line of the circuit board CB1. A portion of the circuit board CB1 may be connected to a signal input device, and another portion of the circuit board CB1 may be connected to the display panel PA. The line of the circuit board CB1 may be a line connecting the portion and the another portion of the circuit board CB1.

For example, the circuit board CB1 may overlap the bonding region BOA of the display panel PA at a position spaced apart from the portion of the circuit board CB1.

For example, a first hole HO1 may be defined in the circuit board CB1. The first hole HO1 may be defined at a position overlapping the driving chip IC in a plan view. A detailed description of the first hole HO1 defined in the circuit board CB1 will be described below with reference to FIGS. 3 and 4.

In an embodiment, in a plan view, the first portion PA1 of the circuit board CB1 may have a first area, and the third portion PA3 of the circuit board CB1 may have a second area. The second area may be smaller than the first area. A detailed description of the first area and the second area will be described below with reference to FIGS. 5, 6, 7, and 8.

The battery may be disposed on the display panel PA. In another embodiment, the battery may be omitted, and the display device 100 may include a power supply device. For example, the power supply device may include an adapter or the like. A detailed description of the battery will be described below with reference to FIG. 8.

The display device 100 may have a COP-FOP (the driving chip on the display panel—the "FPCB" on the display panel) structure.

The driving chip IC may be disposed on the display panel PA. For example, the driving chip IC may be disposed on the display panel PA between the display region AA and the bonding region BOA.

The circuit board CB1 may be disposed on the display panel PA. For example, the display panel PA and the circuit board CB1 may be compressed at the bonding region BOA of the display panel PA.

For example, in case that the display device 100 has the COP-FOP structure, the driving chip IC may be disposed on the display panel PA, the circuit board CB1 may be disposed on the driving chip IC, and an interference may occur at a portion where the driving chip IC and the circuit board CB1 overlap with each other in a plan view.

As shown in FIG. 3, the first hole HO1 may not be defined in the circuit board CB' included in a display device 100' according to the comparative embodiment. In case that the first hole HO1 is not defined in the circuit board CB1, the portion of the circuit board CB1 overlapping the driving chip IC may be deformed to be convex outward. The outwardly convexly deformed portion may adversely affect assembly characteristics between the display device 100' and other electronic devices.

On the other hand, as shown in FIG. 4, the display device 100 according to an embodiment may include the circuit board CB1 with the first hole HO1 defined. The first hole HO1 may be defined at a position overlapping the driving chip IC in a plan view. Accordingly, an interference at the portion where the driving chip IC and the circuit board CB1 overlap may be prevented.

In a plan view, an area of the first hole HO1 may be greater than an area of the driving chip IC. Accordingly, flatness at the portion where the circuit board CB1 and the driving chip IC overlap may be maintained.

FIGS. 5, 6, 7, and 8 are views illustrating an effect of the display device of FIG. 1.

Figure 5:
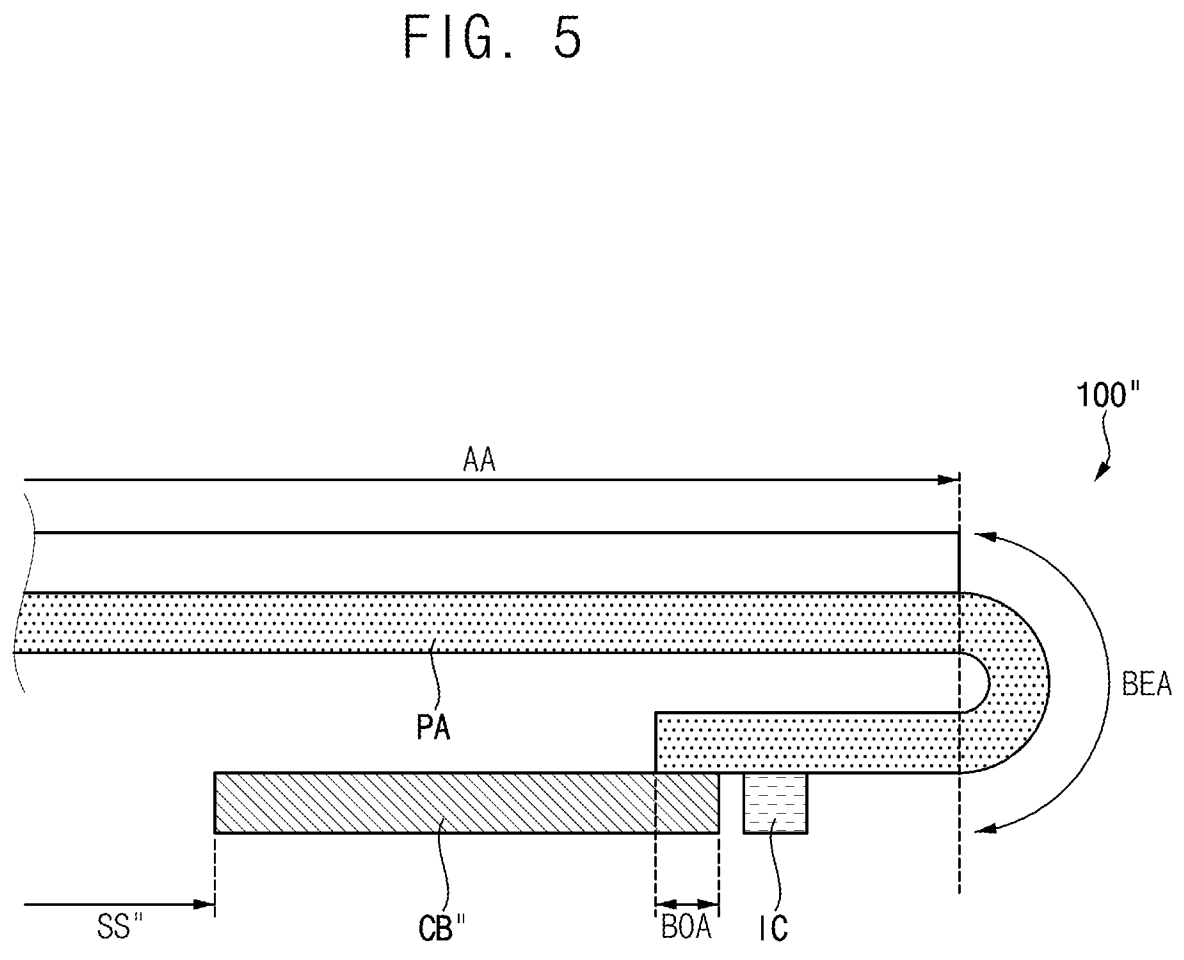
Figure 6:
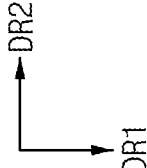
Figure 7:
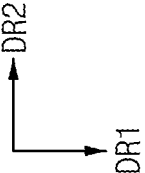

For example, FIGS. 5 and 6 are schematic plan and cross-sectional views of the display device according to the comparative embodiment. FIGS. 7 and 8 are schematic plan and cross-sectional views of the display device according to an embodiment of the disclosure.

Referring to FIGS. 5 and 6, in the display device 10" according to the comparative embodiment, the circuit board C" may be pressed at an end of the display panel PA, and an area of the dead space D" excluding the display region AA of the display panel PA may be large. A dead space DS" may correspond to a non-display region.

A set space SS" may be small. For example, the set space SS" may be a space in which a part such as the battery is disposed. In another example, the set space SS" may be a space in which the display panel PA may be rolled in a case of a slidable display device.

On the other hand, referring to FIGS. 7 and 8, in the display device 100 according to an embodiment of the disclosure, the circuit board CB1 may be pressed from an inside of the display panel PA, not from the end of the display panel PA.

In an embodiment, the first portion PA1 of the circuit board CB1 may be disposed to overlap the display panel PA between the bending region BEA and the bonding region BOA of the display panel PA in a plan view. The second portion PA2 may extend from the first portion PA1 in the first direction DR1 and overlap the bonding region BOA of the display panel PA in a plan view. The third portion PA3 may extend from the second portion PA2 in the first direction DR1 and offset from the display panel PA in a plan view.

The circuit board CB" included in the display device 100" according to the comparative embodiment may overlap the display panel PA only in the bonding region BOA. On the other hand, the circuit board CB1 included in the display device 100 according to an embodiment of the disclosure may include the first portion PA1 and the second portion PA2. The second portion PA2 may overlap the bonding region BOA, and the first portion PA1 may overlap a portion positioned inside the bonding region BOA of the display panel PA in a plan view.

Accordingly, the dead space DS of the display device 100 according to an embodiment may be smaller than the dead space DS" of the display device 100" according to the comparative embodiment. For example, the display device 100 according to an embodiment of the disclosure may be smaller or thinner than the display device 100" according to the comparative embodiment.

A set space SS of the display device 100 according to an embodiment of the disclosure may be greater than the set space SS" of the display device 100" according to the comparative embodiment. Accordingly, the display device 100 according to an embodiment of the disclosure may include a large-capacity battery BA.

In an embodiment, the battery BA may be disposed on the display panel PA. For example, the battery BA may be disposed on a lower surface BS of the display panel PA. In a plan view, the upper surface of the display panel PA where the pixels are disposed may overlap the circuit board CB1, and the lower surface of the display panel PA spaced farthest from the upper surface of the display panel PA may overlap the battery BA.

For example, the display device 100 according to an embodiment of the disclosure may secure a space in which a large-capacity battery may disposed or additionally secure the space in which the display panel PA may be rolled for a slidable display device.

In an embodiment, in a plan view, the first portion PA1 of the circuit board CB1 may have a first area, and the third portion PA3 of the circuit board CB1 may have a second area. The first area may be greater than the second area. In another embodiment, the first area may be equal to the second area.

As the first portion PA1 of the display device 100 increases, a size of the non-display region excluding the display region AA may decrease in a plan view. Accordingly, according to an embodiment of the disclosure, a size and a thickness of the display device 100 may decrease.

As the first portion PA1 of the display device 100 increases, a protruding length of the circuit board CB1 from the display panel PA may decrease in a cross-sectional view. Accordingly, the set space SS of the display device 100 according to an embodiment of the disclosure may be increased.

Figure 9:
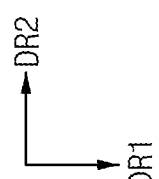
FIG. 9 is a plan view of a display device according to an embodiment of the disclosure.
Figure 10:
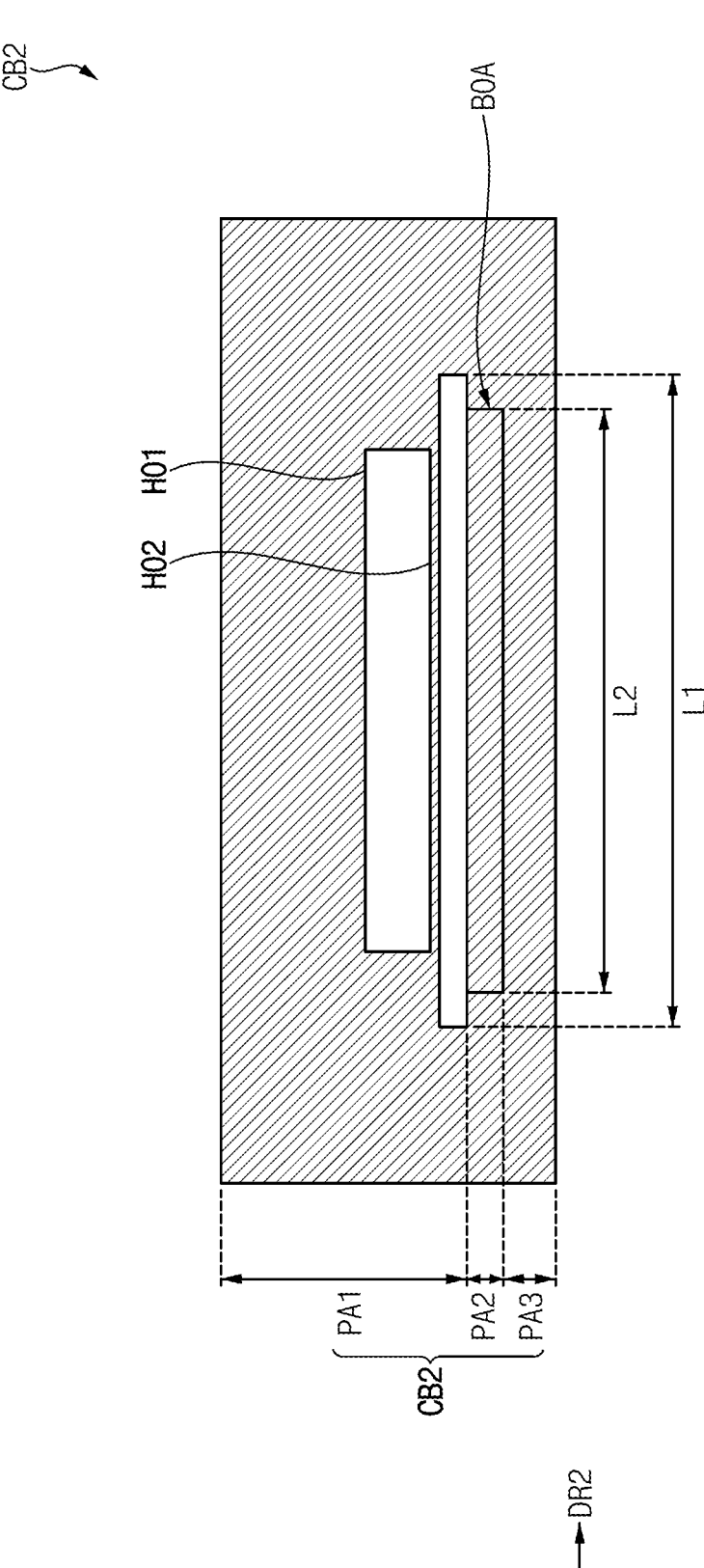
FIGS. 10, 11, and 12 are views illustrating a circuit board included in the display device of FIG. 9.
Figure 11:
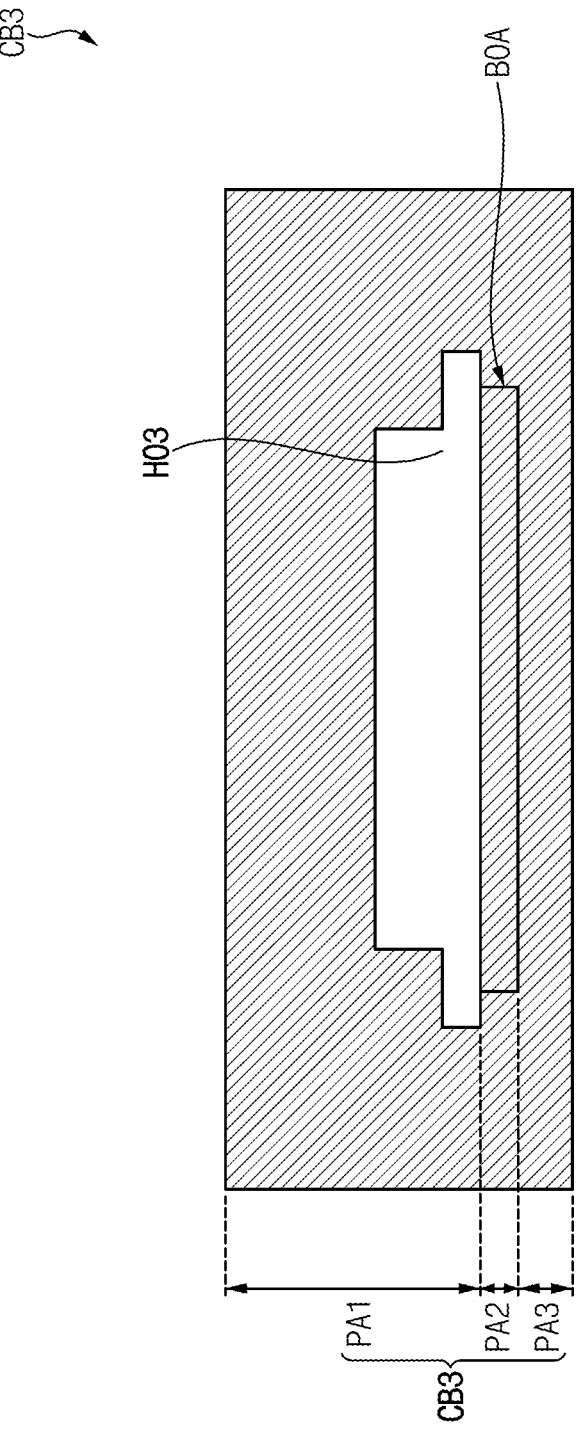
Figure 12:
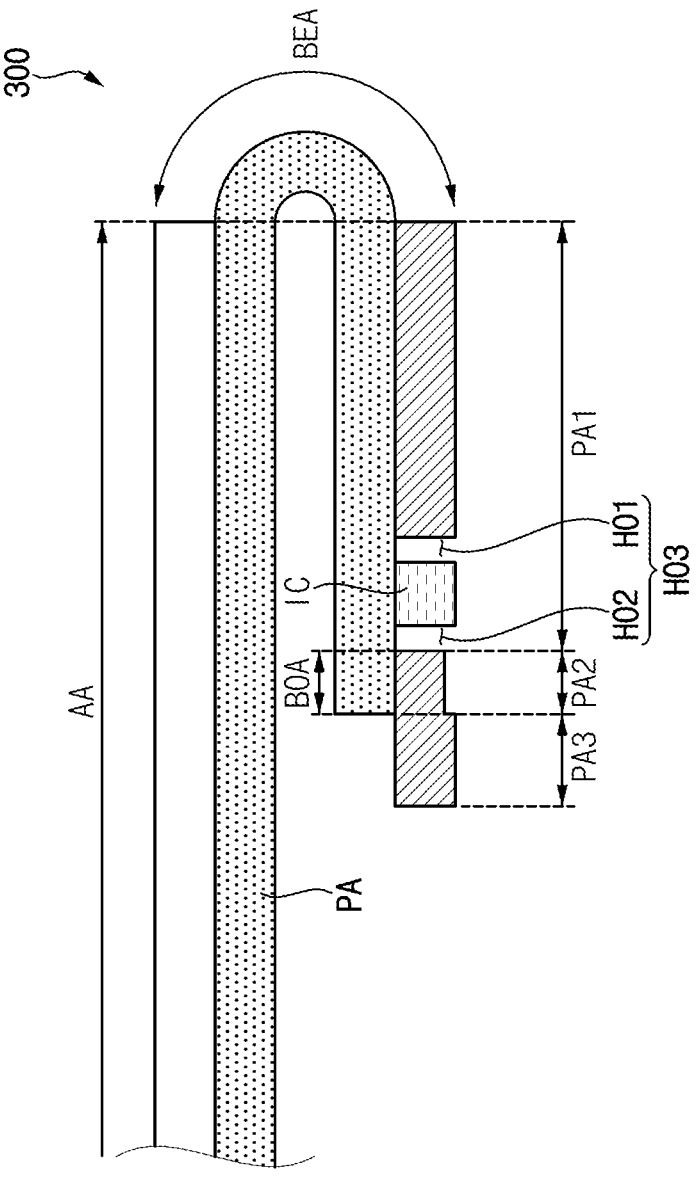

FIG. 9 is a plan view of a display device according to an embodiment of the disclosure. FIGS. 10, 11, and 12 are views illustrating a circuit board included in the display device of FIG. 9.

For example, FIG. 10 is a plan view of the circuit board of FIG. 9 according to an embodiment. FIG. 11 is a plan view illustrating the circuit board of FIG. 9 according to an embodiment. FIG. 12 is a schematic cross-sectional view illustrating a third hole defined in the circuit board of FIG. 11. Hereinafter, descriptions overlapping those of the display device 100 described above with reference to FIGS. 1 to 8 will be omitted or simplified.

Referring to FIGS. 9, 10, 11, and 12, a display device 200 according to an embodiment of the disclosure may include the display panel PA, the driving chip IC, and a circuit board CB2.

The display panel PA may include the display region AA and the bonding region BOA.

The pixels (e.g., the pixels PX of FIG. 1) may be disposed in the display region AA.

The bonding region BOA may be spaced apart from the display region AA in the first direction DR1. The pad electrodes may be disposed in the bonding region BOA.

In an embodiment, the display panel PA may further include the bending region BEA between the display region AA and the bonding region BOA. The display panel PA may be curved in the bending region BEA. In another embodiment, the bending region BEA may be omitted in the display panel PA.

The driving chip IC may be disposed on the display panel PA. For example, the driving chip IC may be disposed between the display region AA and the bonding region BOA.

The circuit board CB2 may be disposed on the display panel PA. The circuit board CB2 may include the first portion PA1, the second portion PA2, and the third portion PA3.

The first portion PA1 may overlap the display panel PA between the display region AA and the bonding region BOA in a plan view.

The second portion PA2 may extend from the first portion PA1 in the first direction DR1 and overlap the bonding region BOA of the display panel PA in a plan view. For example, the second portion PA2 may be a portion of the display panel PA to which pressure is applied.

The third portion PA3 may extend from the second portion PA2 in the first direction DR1 and be spaced apart from the display panel PA. In an embodiment, the third portion PA3 of the circuit board CB2 may be a space in which a line is disposed. For example, the line may be a line of the circuit board CB2. For example, the circuit board CB2 may overlap the bonding region BOA of the display panel PA at a position spaced apart from an end of the circuit board CB2.

In an embodiment, in a plan view, the first portion PA1 of the circuit board CB2 may have a first area, and the third portion PA3 of the circuit board CB2 may have a second area. The second area may be smaller than the first area. In another embodiment, the first area and the second area may be equal.

As the first portion PA1 of the display device 200 increases, the size of the non-display region excluding the display region AA may decrease in a plan view. Accordingly, a size and a thickness of the display device 200 according to an embodiment of the disclosure may decrease.

As the first portion PA1 of the display device 200 increases, a protruding length of the circuit board CB2 from the display panel PA may decrease in a cross-sectional view. Accordingly, the set space SS (e.g., the set space SS of FIG. 8) of the display device 200 according to an embodiment of the disclosure may be increased.

In an embodiment, the display device 200 may have a COP-FOP (the driving chip on the display panel—the "FPCB" on the display panel) structure. In case that the display device 200 has a COP-FOP structure, the driving chip IC may be disposed on the display panel PA, the circuit board CB2 may be disposed on the driving chip IC, and an interference may occur at a portion where the driving chip IC and the circuit board CB2 overlap with each other in a plan view.

In an embodiment, in a plan view, the area of the first hole HO1 may be greater than the area of the driving chip IC in a plan view. Accordingly, flatness at the portion where the circuit board CB2 and the driving chip IC overlap may be maintained.

In an embodiment, the circuit board CB2 may be pressed against the display panel PA at the bonding region BOA of the display panel PA, and the display device 200 may include the circuit board CB2 with a second hole HO2 is defined.

In an embodiment, the second hole HO2 may be defined in the circuit board CB2 at a position adjacent to the bonding region BOA. For example, the second hole HO2 may be defined in the first portion PA1 of the circuit board CB2. For example, the second hole HO2 may be aligned with a first side SD of the bonding region BOA.

In an embodiment, a width L1 of the second hole HO2 may be greater than a width L2 of the bonding region BOA. Each of the width L1 of the second hole HO2 and the width L2 of the bonding region BOA may be a width in a second direction DR2. The second direction DR2 may intersect the first direction DR1. For example, the first direction DR1 and the second direction DR2 may be perpendicular to each other.

In an embodiment, the first and second holes HO1 and HO2 may be integral with each other (e.g., a third hole HO3 of FIG. 11). The third hole HO3 may be defined at a position overlapping the driving chip IC in a plan view. The third hole HO3 may be aligned with the first side SD of the bonding region BOA.

The second hole HO2 defined in the circuit board CB2 may relieve stress applied to a compression portion (e.g., the bonding region BOA).

The display panel PA and the circuit board CB2 may be thermally compressed at a position overlapping the bonding region BOA in a plan view. Accordingly, the display panel PA and the circuit board CB2 may be electrically connected.

A level difference may occur between the compression portion and a portion other than the compression portion. In other words, a level of an upper surface of a circuit board CB3 may not be constant in the bonding region BOA and other regions. For example, the level of the top surface of the circuit board CB3 in the bonding region BOA may be lower than the level of the top surface of the circuit board CB3 in regions other than the bonding region BOA. Accordingly, the circuit board CB3 may receive stress to be restored to a position before being compressed. In order to prevent the stress, a step difference at an end of the compression portion may be removed by forming the second hole HO2 in the circuit board CB2.

As described above, the first hole HO1 and the second hole HO2 may be formed to be integral with each other in the circuit board CB3 (e.g., the third hole HO3 in FIG. 11), and the third hole HO3 may be defined at the position overlapping the driving chip IC to avoid the interference with the driving chip IC. The third hole HO3 may be defined to be align with the first side SD of the bonding region BOA in order to eliminate the level difference.

Figure 13:
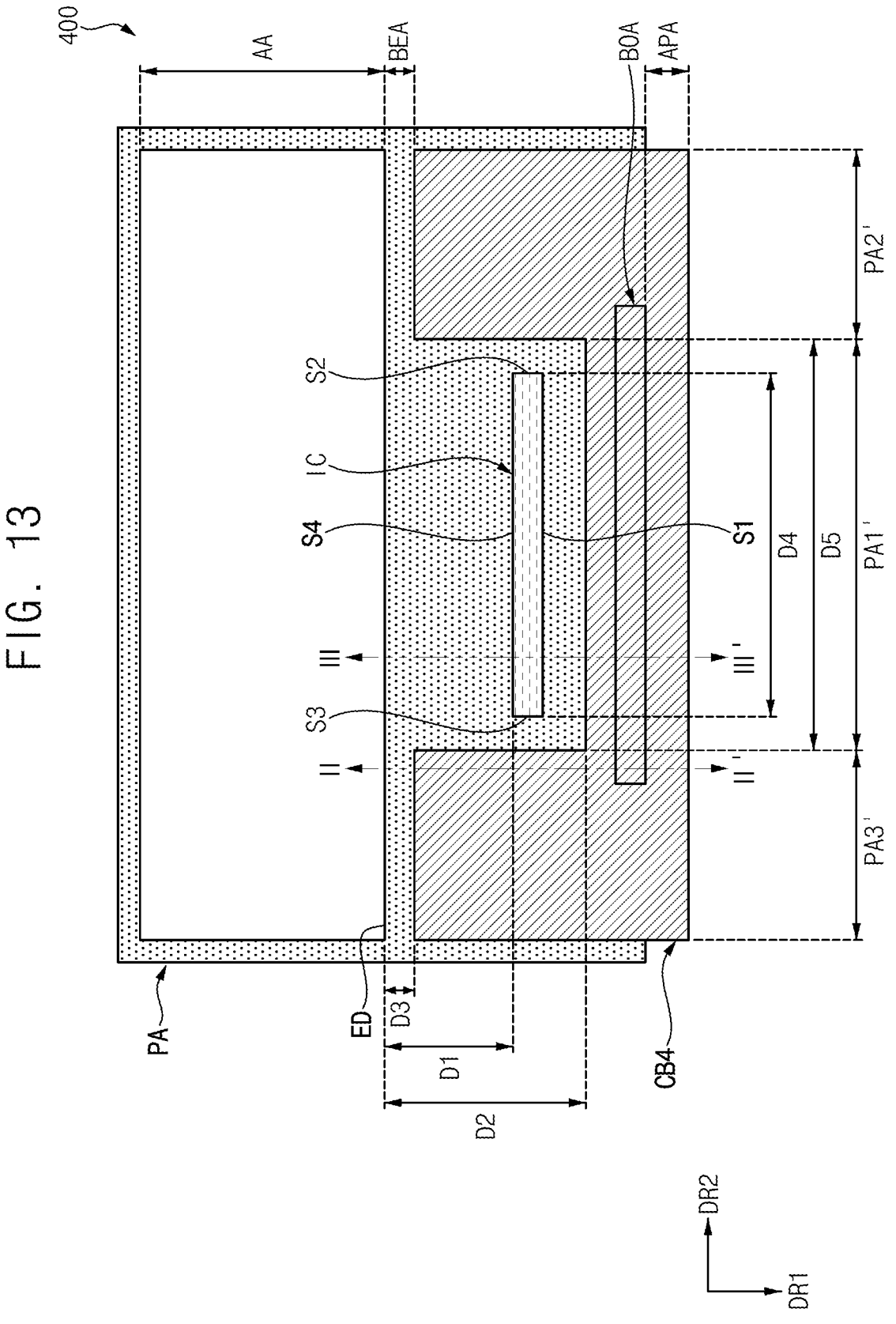
FIG. 13 is a plan view of a display device according to an embodiment of the disclosure.
Figure 14:
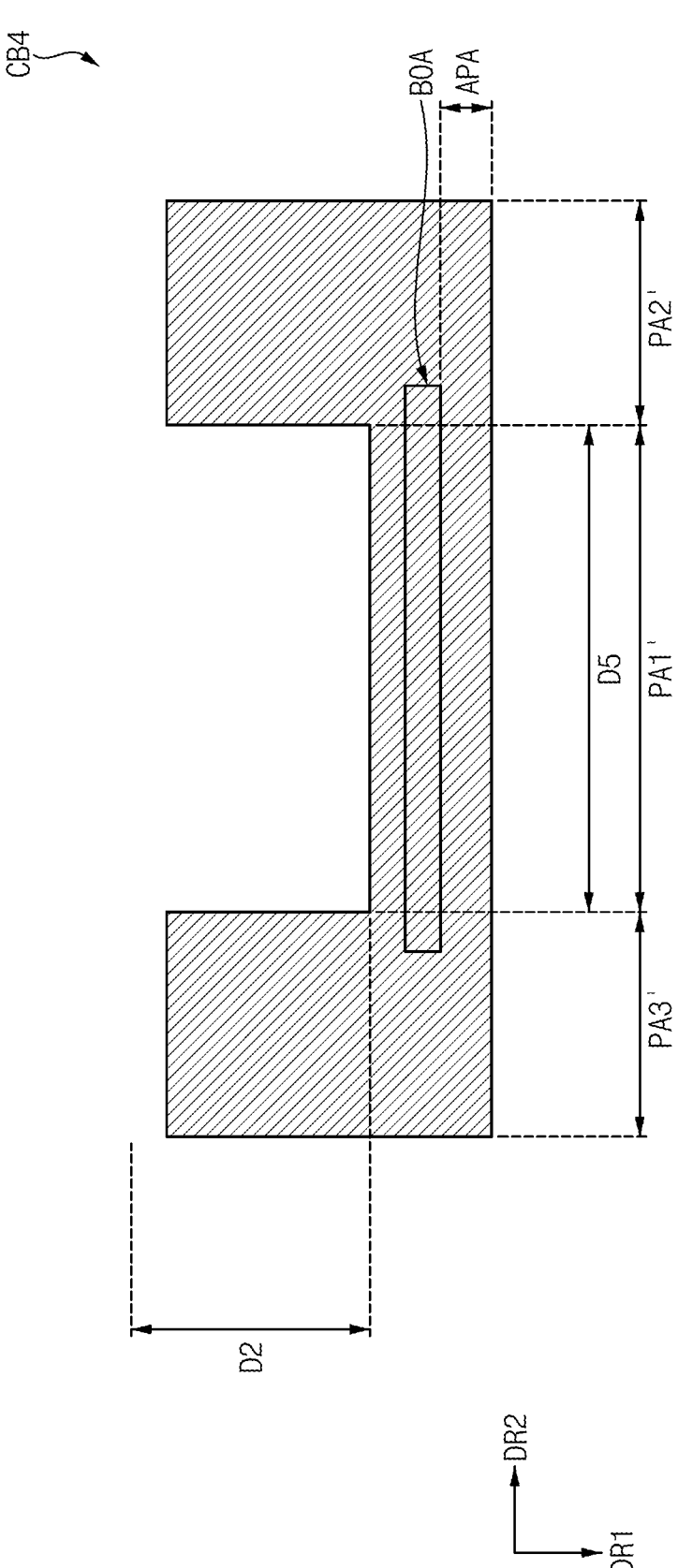
FIG. 14 is a plan view of a circuit board of FIG. 13.
Figure 15:
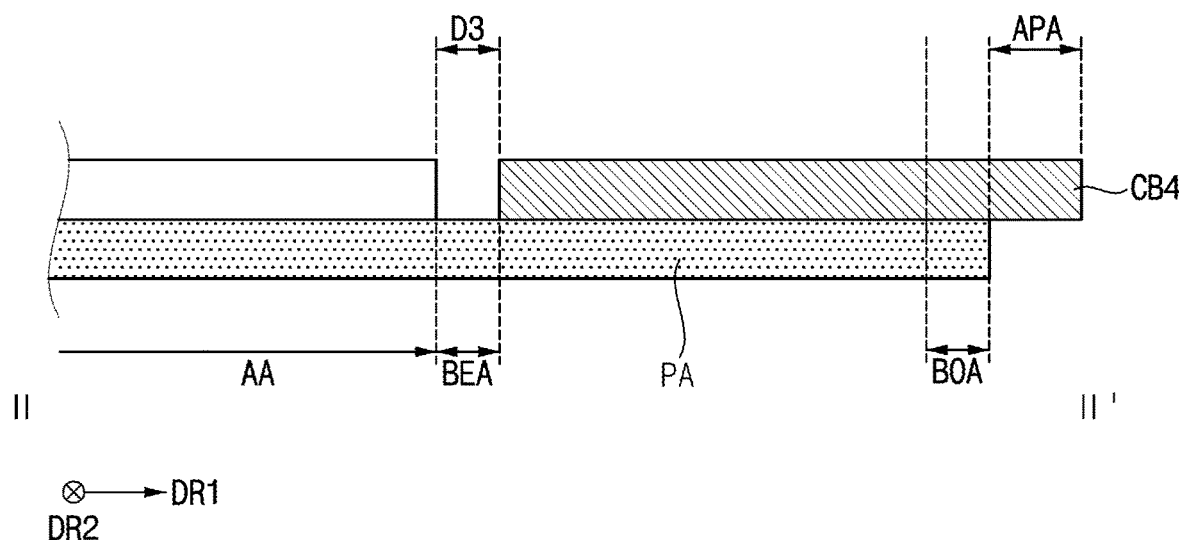
FIG. 15 is a schematic cross-sectional view taken along line II-II' of FIG. 13.
Figure 16:
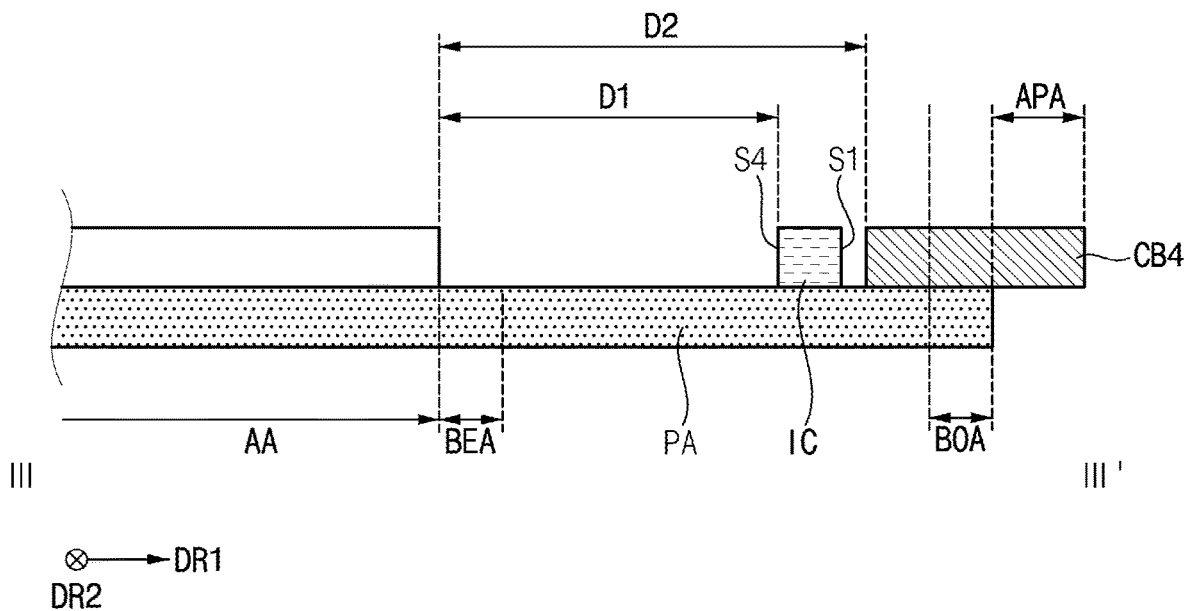
FIG. 16 is a schematic cross-sectional view taken along line III-III' of FIG. 13.

FIG. 13 is a plan view of a display device according to an embodiment of the disclosure. FIG. 14 is a plan view of a circuit board of FIG. 13. FIG. 15 is a schematic cross-sectional view taken along line II-II' of FIG. 13. FIG. 16 is a schematic cross-sectional view taken along line III-III' of FIG. 13. Hereinafter, descriptions overlapping those of the display device 100, 200, or 300 described above with reference to FIGS. 1 to 12 will be omitted or simplified.

Referring to FIGS. 13, 14, 15, and 16, a display device 400 according to an embodiment of the disclosure may include the display panel PA, the driving chip IC, and a circuit board CB4.

The display panel PA may include the display region AA and the bonding region BOA.

The pixels (e.g., the pixels PX of FIG. 1) may be disposed in the display region AA.

The bonding region BOA may be spaced apart from the display region AA in the first direction DR1. The pad electrodes may be disposed in the bonding region BOA.

In an embodiment, the display panel PA may further include the bending region BEA between the display region AA and the bonding region BOA. The display panel PA may be curved in the bending region BEA. In another embodiment, the bending region BEA may be omitted in the display panel PA.

The driving chip IC may be disposed on the display panel PA. For example, the driving chip IC may be disposed between the display region AA and the bonding region BOA.

The circuit board CB4 may be disposed on the display panel PA. The circuit board CB4 may be disposed to overlap the display panel PA between the display region AA and the bonding region BOA in a plan view. For example, the circuit board CB4 may be disposed to overlap the display panel PA between the bending region BEA and the bonding region BOA in a plan view. However, the disclosure is not limited thereto. In case that the display device 400 includes a rigid substrate, the circuit board CB4 may be disposed adjacent to the display region AA.

In an embodiment, the display device 400 may have a COP-FOP (the driving chip on the display panel—the "FPCB" on the display panel) structure. In case that the display device 400 has a COP-FOP structure, the driving chip IC may be disposed on the display panel PA, the circuit board CB4 may be disposed on the driving chip IC, and an interference may occur at a portion where the driving chip IC and the circuit board CB4 overlap with each other in a plan view.

As described above, in case that the driving chip IC is disposed on the display panel PA and the circuit board CB4 is disposed on the driving chip IC, the portion of the circuit board CB4 overlapping the driving chip IC may be deformed to be convex outward. The outwardly convexly deformed portion may adversely affect the assembly characteristics between the display device according to the comparative embodiment and other electronic devices.

The display device 400 according to an embodiment of the disclosure may include the circuit board CB4 including a first portion PA1', a second portion PA2', and a third portion PA3'.

In an embodiment, the first portion PA1' of the circuit board CB4 may be spaced apart from a first side S1 of the driving chip IC. The first side S1 of the driving chip IC may be a side farthest from the display region AA in the first direction DR1.

The second portion PA2' may be spaced apart from a second side S2 of the driving chip IC in the second direction DR2. The second direction DR2 may be the direction intersecting the first direction DR1. For example, the first direction DR1 and the second direction DR2 may be perpendicular to each other. The second side S2 may intersect the first side S1 in the second direction DR2. For example, the first side S1 and the second side S2 may be perpendicular to each other.

The third portion PA3' may be spaced apart from a third side S3 of the driving chip IC in a direction opposite to the second direction DR2. The third side S3 may face the second side S2 in the second direction DR2.

In an embodiment, a width D4 of the driving chip IC may be smaller than a width D5 of the first portion PA1'. Each of the width D4 of the driving chip IC and the width D5 of the first portion PA1' of the circuit board CB4 may be a width in the second direction DR2. Accordingly, flatness at the portion where the circuit board CB4 and the driving chip IC overlap with each other in a plan view may be maintained.

In an embodiment, in a plan view, a vertical distance D1 between an end of the display region AA and an end of the driving chip IC may be less than a vertical distance D2 between the end of the display region AA and an end of first portion PA1' in the first direction DR1. In a plan view, the vertical distance D1 between the end of the display region AA and the end of the driving chip IC may be greater than a vertical distance D3 between the end of the display region AA and an end of third portion PA3' in the first direction DR1.

In an embodiment, the circuit board CB4 may have a partially open shape. For example, the circuit board CB4 may have a 'U' shape. Accordingly, the driving chip IC may be disposed between the display region AA and the first portion PA1'. For example, the 'U'-shaped circuit board CB4 may overlap the display panel PA and may not overlap the driving chip IC in a plan view. However, the disclosure is not limited thereto, and the shape of the circuit board CB4 is not limited as long as it overlaps the display panel PA and not overlaps the driving chip IC in a plan view.

In an embodiment, the circuit board CB4 may further include an alpha region APA extending in the first direction DR1 from a portion overlapping the bonding region BOA. The alpha region APA may not overlap the display panel PA in a plan view.

In an embodiment, the alpha region APA of the circuit board CB4 may be a space where a line is disposed. For example, the line may be a line within the circuit board CB4. A portion of the circuit board CB4 may be connected to the signal input device, and another portion of the circuit board CB4 may be connected to the display panel PA. The line in the circuit board CB4 may be a line connecting the portion and the another portion of the circuit board CB4.

For example, the circuit board CB4 may overlap the bonding region BOA of the display panel PA in a plan view at a position spaced apart from the portion of the circuit board CB4.

Figure 17:
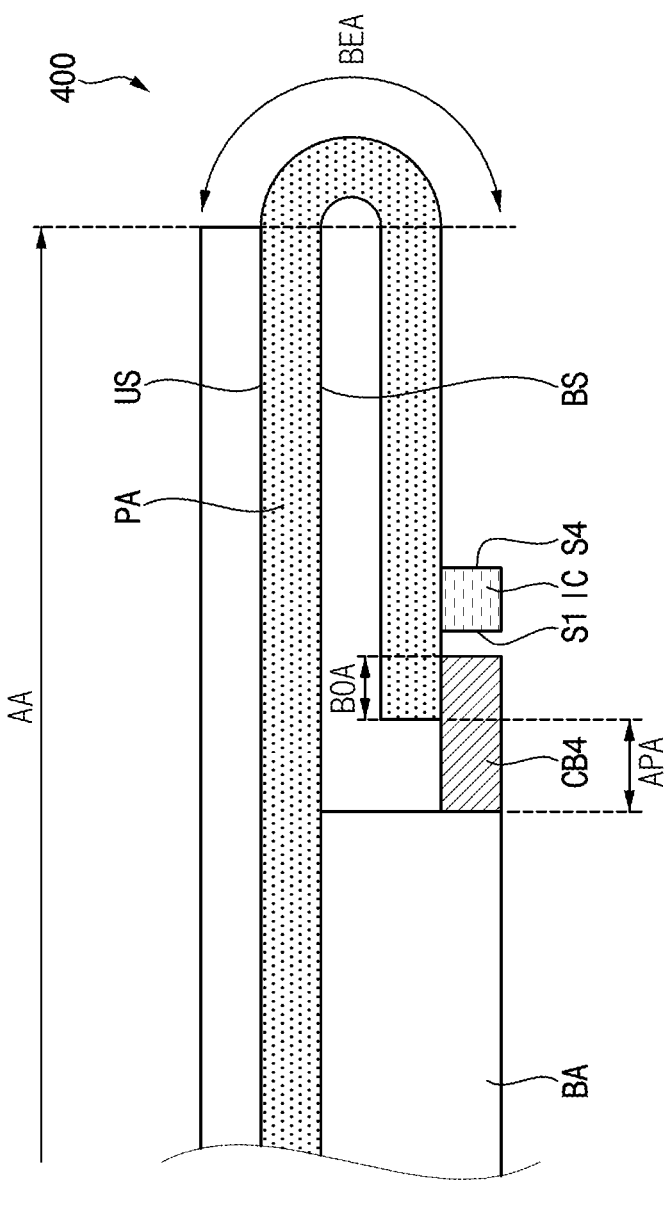
FIG. 17 is a view illustrating an effect of the display device of FIG. 13.

FIG. 17 is a view illustrating an effect of the display device of FIG. 13.

Referring to FIGS. 13 and 17, the circuit board CB4 may be pressed from the inside of the display panel PA, not from the end of the display panel PA.

In an embodiment, the display device 400 may further include a battery BA. In a cross-sectional view, the lower surface BS of the display panel PA may overlap the battery BA, and the upper surface US of the display panel PA may overlap the driving chip IC, the circuit board CB4 in a plan view. The lower surface BS of the display panel PA may be farthest from the upper surface US of the display panel PA.

As an area where the display panel PA and the circuit board CB4 overlap increases, a size and a thickness of the display device 400 may decrease, and the set space (e.g., the set space SS of FIG. 8) may be increased.

The embodiments of the disclosure may be applied to various display devices that may include a display device. For example, the disclosure may be applied to a high-resolution smartphone, a mobile phone, a smart pad, a smart watch, a tablet PC, a vehicle navigation system, a television, a computer monitor, a laptops, or the like.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display panel including:
   a display region in which a plurality of pixels are disposed; and
   a bonding region spaced apart from the display region in a first direction and in which a plurality of pad electrodes are disposed; and
a circuit board disposed on the display panel and including a first portion overlapping the display panel between the display region and the bonding region in a plan view; and
a driving chip disposed on the display panel between the display region and the bonding region,
wherein a first hole is defined in the circuit board at a position accommodating the driving chip in a plan view, and
wherein an area of the first hole is greater than an area of the driving chip.

2. The display device of claim 1, wherein
the circuit board further includes a second portion, and
the second portion extends from the first portion in the first direction and overlaps the bonding region of the display panel in a plan view.

3. The display device of claim 2, wherein
the circuit board further includes a third portion,
the third portion extends from the second portion in the first direction and is spaced apart from the display panel, and
the third portion is a space in which a line is disposed.

4. The display device of claim 3, wherein in a plan view, the first portion of the circuit board has a first area, and the third portion of the circuit board has a second area less than the first area.

5. The display device of claim 1, wherein a second hole is further defined in the circuit board at a position adjacent to the bonding region of the display panel.

6. The display device of claim 5, wherein
a width of the second hole is greater than a width of the bonding region, and
each of the width of the second hole and the width of the bonding region is a width in a second direction intersecting the first direction.

7. The display device of claim 6, wherein the first hole and the second hole are integral with each other.

8. The display device of claim 1, wherein
the display panel further includes a bending region between the display region and the bonding region, and
the display panel is curved in the bending region.

9. The display device of claim 8, wherein the first portion of the circuit board is disposed overlapping the display panel between the bending region and the bonding region in a plan view.

10. The display device of claim 1, further comprising:
a battery, wherein the circuit board overlaps an upper surface of the display panel on which the plurality of pixels are disposed in a plan view, and
the battery overlaps a lower surface of the display panel farthest from the upper surface of the display panel in a plan view.

11. A display device comprising:
a display panel including:
   a display region in which a plurality of pixels are disposed; and
   a bonding region spaced apart from the display region in a first direction and in which a plurality of pad electrodes are disposed;
a driving chip disposed on the display panel between the display region and the bonding region; and
a circuit board including:
   a first portion spaced apart from a first side of the driving chip that is disposed farthest from the display region in the first direction;
   a second portion spaced apart from a second side of the driving chip intersecting the first side of the driving chip in a second direction intersecting the first direction; and
   a third portion spaced apart from a third side of the driving chip facing the second side of the driving chip in a direction opposite to the second direction.

12. The display device of claim 11, wherein a vertical distance between an end of the display region and an end of the driving chip is less than a vertical distance between the end of the display region and an end of the first portion of the circuit board in the second direction.

13. The display device of claim 11, wherein a vertical distance between an end of the display region and an end of the driving chip is greater than a vertical distance between the end of the display region and an end of the third portion of the circuit board in the second direction.

14. The display device of claim 11, wherein
the display panel further includes a bending region between the display region and the bonding region, and
the display panel is curved in the bending region.

15. The display device of claim 14, wherein the circuit board is disposed overlapping the display panel between the bending region and the bonding region in a plan view.

16. The display device of claim 11, wherein
a width of the driving chip is less than a width of the first portion of the circuit board, and
each of the width of the driving chip and the width of the first portion of the circuit board is a width in the second direction.

17. The display device of claim 11, wherein
the circuit board further includes an alpha region extending in the first direction from a portion of the circuit board overlapping the bonding region in a plan view, and
the alpha region is a space in which a line is disposed.

18. The display device of claim 11, further comprising:
a battery, wherein
the driving chip and the circuit board overlap an upper surface of the display panel on which the plurality of pixels are disposed in a plan view, and
the battery overlaps a lower surface of the display panel farthest from the upper surface of the display panel, in a plan view.

* * * * *